United States Patent
Takeda

(10) Patent No.: US 9,432,029 B2
(45) Date of Patent: Aug. 30, 2016

(54) FREQUENCY MODULATION CIRCUIT AND SEMICONDUCTOR DEVICE

(71) Applicant: LAPIS Semiconductor Co., Ltd., Yokohama (JP)

(72) Inventor: Osamu Takeda, Yokohama (JP)

(73) Assignee: LAPIS SEMICONDUCTOR CO., LTD., Yokohama (JP)

(*) Notice: Subject to any disclaimer, the term of this patent is extended or adjusted under 35 U.S.C. 154(b) by 0 days.

(21) Appl. No.: 14/977,729

(22) Filed: Dec. 22, 2015

(65) Prior Publication Data

US 2016/0191064 A1 Jun. 30, 2016

(30) Foreign Application Priority Data

Dec. 24, 2014 (JP) .................. 2014-261136

(51) Int. Cl.
*H03L 7/06* (2006.01)
*H03L 7/085* (2006.01)
*H03L 7/099* (2006.01)

(52) U.S. Cl.
CPC ............ *H03L 7/085* (2013.01); *H03L 7/099* (2013.01)

(58) Field of Classification Search
CPC . H04L 7/0041; H04L 7/0331; H04L 7/0058; H04L 7/235; H04L 25/03057; H04L 25/03025
USPC ............. 327/156–159, 147–150, 113–122; 375/373–376; 331/1 R, 1 A
See application file for complete search history.

(56) References Cited

U.S. PATENT DOCUMENTS

| 7,366,256 B2* | 4/2008 | Eudes | H04L 27/3872 375/324 |
| 8,873,693 B2* | 10/2014 | Nedovic | H03L 7/235 327/147 |
| 2008/0260071 A1* | 10/2008 | Sidiropoulos | H03L 7/081 375/334 |
| 2012/0169387 A1* | 7/2012 | Hara | H03L 7/16 327/156 |
| 2014/0055179 A1* | 2/2014 | Gong | H03L 7/081 327/156 |
| 2015/0188693 A1* | 7/2015 | Giaconi | H04L 7/0041 375/233 |
| 2016/0006557 A1* | 1/2016 | Shirakawa | H04L 27/22 375/362 |

FOREIGN PATENT DOCUMENTS

JP H10-22736 A 1/1998

* cited by examiner

*Primary Examiner* — Lincoln Donovan
*Assistant Examiner* — Thomas Skibinski
(74) *Attorney, Agent, or Firm* — Rabin & Berdo, P.C.

(57) ABSTRACT

A frequency modulation circuit includes a calibration-operating part which calculates primary calibration values of modulation index at central frequencies of respective ones of n pieces of TF bands which constitute the entire TF range. Interpolation-calculation part performs an interpolation-calculation with respect to the n pieces of primary calibration values and calculates calibration values at intermediate frequencies of central frequencies of neighboring ones of TF bands while calculating calibration values at frequencies at both ends of entire TF range to obtain (n+1) pieces of interpolated calibration values as secondary calibration values. Calibration value supply part supplies one calibration value corresponding to the TF bands set in the TF band setting part from among the primary calibration values or secondary calibration values to a modulation part performing frequency modulation together with calculation based on the supplied calibration value.

10 Claims, 6 Drawing Sheets

FREQUENCY MODULATION CIRCUIT AND SEMICONDUCTOR DEVICE

BACKGROUND OF THE INVENTION

1. Field of the Invention

The present invention relates to a frequency modulation circuit and a semiconductor device including the frequency modulation circuit.

2. Description of the Related Art

In a wireless communication system, there is performed a frequency modulation such as FSK (Frequency Shift Keying) for performing transmission of binary coded information. For example, a PLL frequency synthesizer having a PLL (Phase Locked Loop) circuit is used as a modulation circuit performing the frequency modulation. The PLL frequency synthesizer may have an occurrence of modulation index fluctuation caused by changes in an environment surrounding the system at such an occasion of frequency modulation of an input data i.e. the binary coded information. Thus, there has been devised a frequency modulation circuit having a function of calibrating (correcting) the modulation index (For example, Japanese patent application kokai No. 10-22736).

SUMMARY OF THE INVENTION

When the frequency modulation circuit is provided with a function of calibrating its modulation index, the calibration of modulation index based on the calibration value uniformly determined previously, the calibration with a higher accuracy cannot be achieved by fluctuation due to changes of environment surrounding the device such as temperature, or by a bad effect due to variation in manufacturing of the circuit, or the like. When the calibration is performed based on actually measured values so that the modulation index is calibrated for an entire frequency range of transmission frequencies, it is necessary that the PLL circuit and its peripheral circuits have to work for a long time period. Namely conventional frequency modulation circuits have a problem without performing the calibration within a short time period.

It is an object of the present invention to provide a frequency modulation circuit capable of frequency modulation with calibrating its modulation index with an enhanced accuracy within a short time period and to provide a semiconductor device including such a frequency modulation circuit.

The frequency modulation circuit according to the present invention is a frequency modulation circuit comprising:

a modulation part for performing a frequency modulation with an input data signal while calibrating a modulation index based on a calibration value;

a transmission frequency band setting part for selecting and setting a transmission frequency band in accordance with a given channel selection signal within an entire transmission frequency range; and a calibration-operating part for calculating, on the basis of said input signal, primary calibration values of the modulation index at the central frequencies of respective ones of n (where the n denotes an integer of 2 or more) pieces of transmission frequency bands which constitute said entire transmission frequency range, further comprising;

an interpolation-calculation part for performing an interpolation-calculation with respect to said n pieces of said primary calibration values and calculating calibration values at intermediate frequencies of the central frequencies of neighboring ones of the transmission frequency bands while calculating calibration values at frequencies at both ends of said entire transmission frequency range to obtain (n+1) pieces of interpolated calibration values as secondary calibration values; and a calibration value supply part for selecting one calibration value corresponding to the transmission frequency bands set in said transmission frequency band setting part from among said n pieces of the primary calibration values or (n+1) pieces of the secondary calibration values, and supplying the selected calibration value to said modulation part.

Further, the semiconductor device according to the present invention is a semiconductor device comprising a frequency modulation circuit for performing a frequency modulation with an input data to output an output signal, said frequency modulation circuit comprising:

a modulation part for performing a frequency modulation with an input data signal while calibrating a modulation index based on a calibration value;

a transmission frequency band setting part for selecting and setting a transmission frequency band in accordance with a given channel selection signal within an entire transmission frequency range; and a calibration-operating part for calculating, on the basis of said input signal, primary calibration values of the modulation index at the central frequencies of respective ones of n (where the n denotes an integer of 2 or more) pieces of transmission frequency bands which constitute said entire transmission frequency range, said frequency modulation circuit further comprising;

an interpolation-calculation part for performing an interpolation-calculation with respect to said n pieces of said primary calibration values and calculating calibration values at intermediate frequencies of the central frequencies of neighboring ones of the transmission frequency bands while calculating calibration values at frequencies at both ends of said entire transmission frequency range to obtain (n+1) pieces of interpolated calibration values as secondary calibration values; and a calibration value supply part for selecting one calibration value corresponding to the transmission frequency bands set in said transmission frequency band setting part from among said n pieces of the primary calibration values or (n+1) pieces of the secondary calibration values, and supplying the selected calibration value to said modulation part.

According to the present invention, it is possible to correct the modulation index with a higher accuracy within a short time period.

BRIEF DESCRIPTION OF THE DRAWINGS

Some aspects and other features of the present invention are explained in the following description, taken in connection with the accompanying drawing figures wherein.

DETAILED DESCRIPTION OF THE INVENTION

Embodiments of the present invention will be described in detail with reference to the accompanying drawings hereinbelow.

EXAMPLE 1

Figure 1:
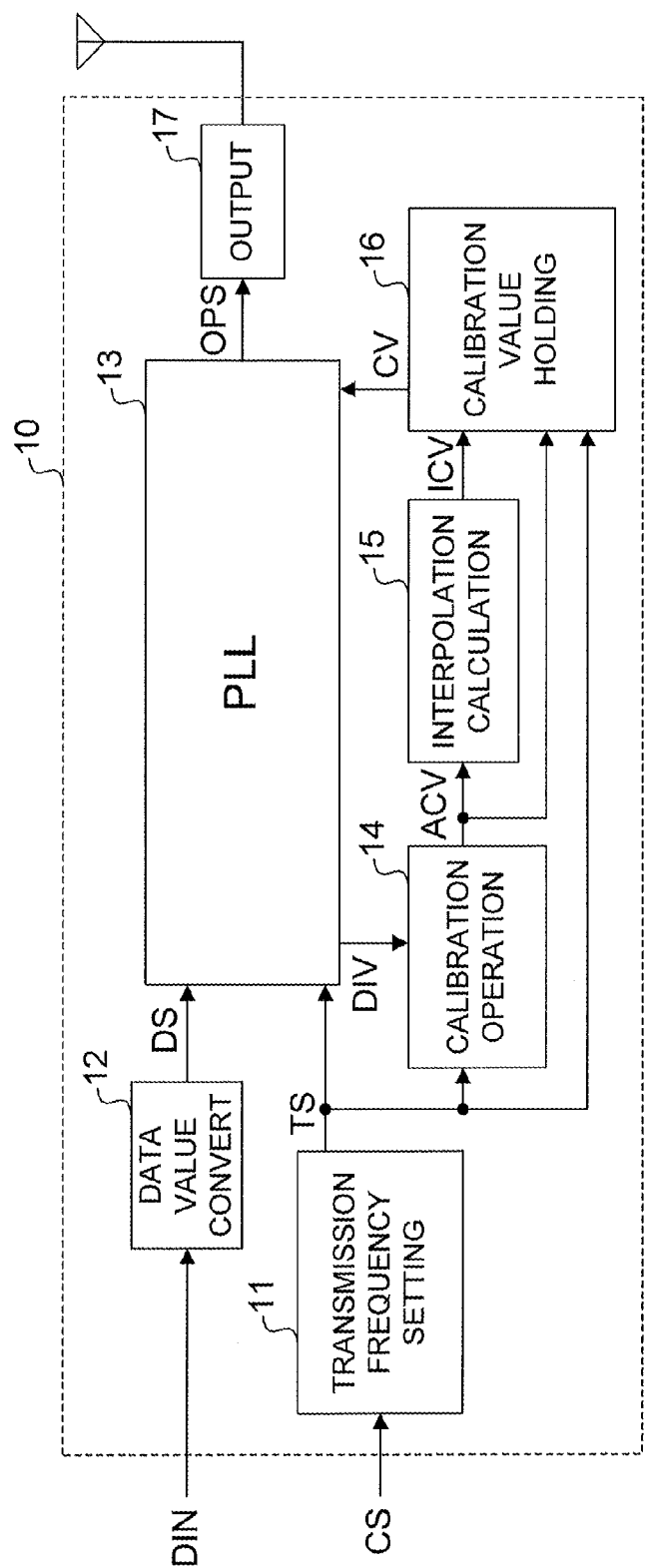
FIG. 1 is a block diagram showing a configuration of a frequency modulation circuit 10.

FIG. 1 is a block diagram showing a configuration of a frequency modulation circuit 10 in Example 1. The frequency modulation circuit 10 may be formed in a semiconductor IC.

The frequency modulation circuit 10 comprises a transmission frequency setting block 11, a data value convert part 12, a PLL (Phase Locked Loop) block 13, a calibration operation block 14, an interpolation calculation block 15, a calibration value holding block 16 and an output part 17.

The transmission frequency setting block 11 receives a channel selection signal CS for selecting or designating a transmission frequency band from a user interface (not shown), and then generates a transmission frequency signal TS in response to the signal CS. The channel selection signal CS is a signal for selecting and designating one channel among the 1st to 78th channels. The 1st to 78th channels correspond to 78 pieces of frequency bands divided from or constituting the entire transmission frequency range of from 2.402 GHz to 2.48 GHz in steps of 1000 kHz respectively. The transmission frequency signal TS is a signal indicating a central frequency value of each of the frequency bands each corresponding to a channel specified by the channel selection signal CS. The transmission frequency setting block 11 supplies the transmission frequency signal TS to the PLL block 13, the calibration operation block 14 and the calibration value holding block 16.

The data value convert part 12 converts signal values of an input data signal DIN consisting of binary serial data of "0" and "1" into predetermined values, for example, "250" and "−250" respectively. The data value convert part 12 supplies the converted signal values successively to the PLL block 13 as a data value signal DS.

The PLL block 13 is a modulation part for receiving the data value signal DS and executing a frequency modulation. The PLL block 13 executes the frequency modulation and generates an output signal OPS and supplies the output signal OPS to the output part 17.

Figure 2:
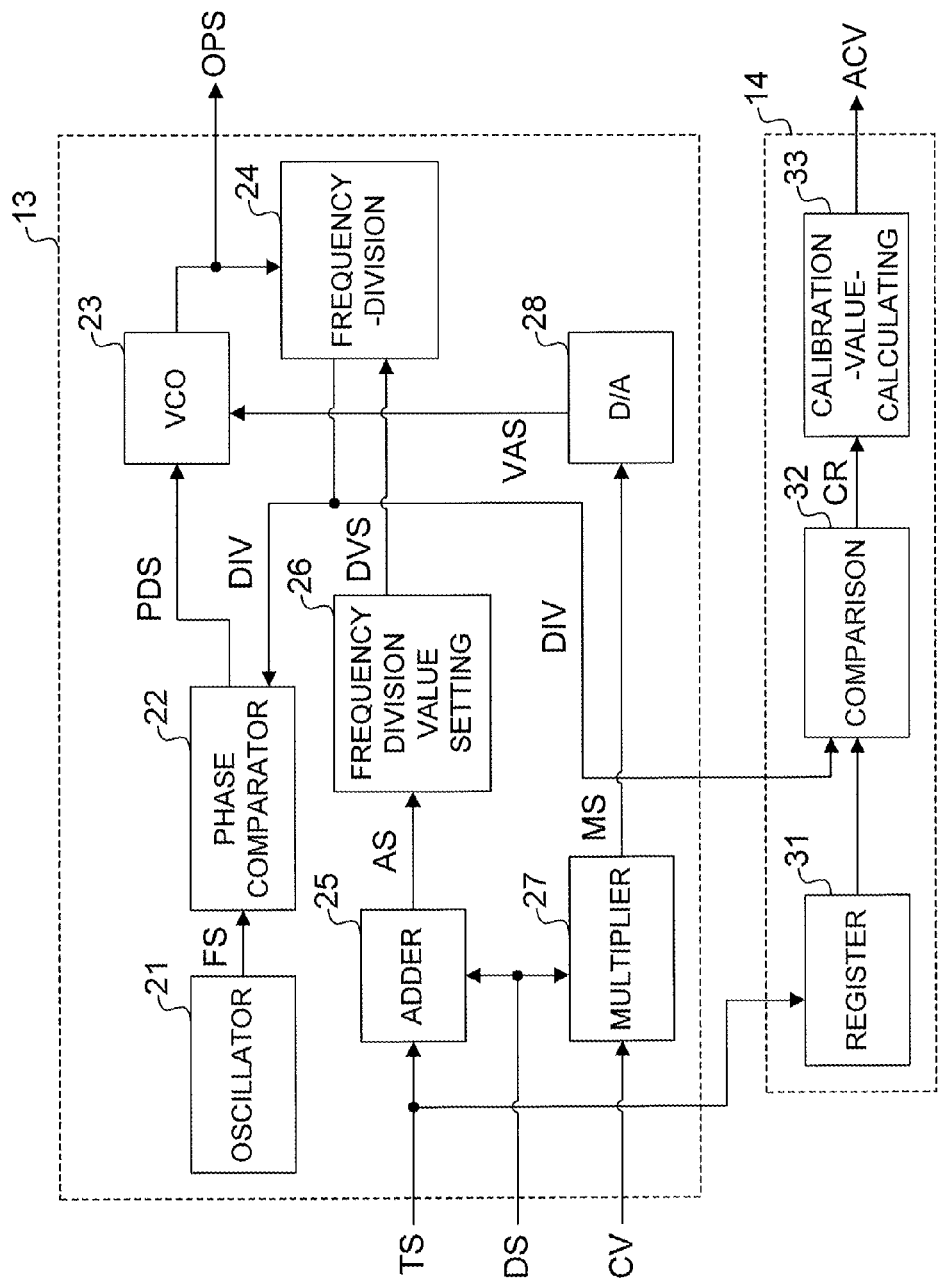
FIG. 2 is a block diagram showing a PLL block 13 and a calibration operation block 14.

FIG. 2 is a block diagram showing the PLL block 13 and the calibration operation block 14. The PLL block 13 includes the oscillator 21, the phase comparator 22, a VCO (Voltage Controlled Oscillator) 23, the frequency-division part 24, the adder part 25, the frequency division value setting part 26, the multiplier part 27 and the D/A converter 28.

The oscillator 21 is configured of a crystal oscillator or the like for generating a source oscillation signal FS having a predetermined source frequency. The oscillator 21 supplies its generated source oscillation signal FS to the phase comparator 22.

The phase comparator 22 compares in phase with each other the source oscillation signal FS supplied from the oscillator 21 and the frequency-divided signal DIV supplied from the frequency-division part 24 and generates a phase difference. The phase comparator 22 supplies a phase difference signal PDS having a voltage value corresponding to or representing the phase difference to the VCO 23.

The VCO 23 oscillates at a frequency changing according to a voltage value of the phase difference signal PDS supplied from the phase comparator 22 thereby to generate an oscillation signal having that frequency. The VCO 23 supplies the oscillation signal as an output signal OPS to the output part 17. Further, the oscillation frequency of the VCO 23 is determined as a general rule according to a data value of a setting signal representing a transmission frequency. Since, however, there occurs fluctuation in dependence on changes in environmental factors such as its temperature or the like, it is desirable to adjust or regulate the oscillation frequency. Thus, the VCO 23 adjusts or regulates the oscillation frequency in response to a VCO adjustment signal VAS supplied from the D/A converter 28.

The frequency-division part 24 divides in frequency the output signal OPS at a frequency division ratio changing according to the frequency division value setting signal DVS supplied from the frequency division value setting part 26 to generate a frequency-divided signal DIV, and supplies the frequency-divided signal DIV to the phase comparator 22 and the comparison part 32 of the calibration operation block 14.

The adder part 25 adds to each other the data value signal DS and the transmission frequency signal TS and generates the addition signal AS and supplies this signal to the frequency division value setting circuit 26.

The frequency division value setting part 26 performs a delta-sigma modulation for the addition signal AS, and generates the frequency division value setting signal DVS to cause the frequency-division part 24 to set the frequency division ratio.

The multiplier part 27 multiplies with each other the data value signal DS and a calibration value CV and generates a multiplication result signal MS indicating a multiplication result and supplies this result signal to the D/A converter 28.

The D/A converter 28 preforms a digital/analog conversion with respect to the multiplication result signal MS supplied from the multiplier part 27 to generates a VCO adjustment signal VAS for adjusting the oscillation frequency of the VCO, and then supplies the VCO adjustment signal VAS to the VCO 23.

Thus, the VCO adjustment signal VAS changes in response to the value of the calibration value CV. Namely, the calibration value CV is a calibration value for adjusting the oscillation frequency of the VCO 23, and is also a calibration value of the modulation index used in the frequency modulation circuit 10 performing the frequency modulation.

The calibration operation block 14 includes the register 31, the comparison part 32 and the calibration-value-calculating part 33. The register 31 stores a target value of the toggle number which is determined previously while taking account of conditions such as an environmental temperature or the like. Here, the toggle number denotes a click number of times of frequency-divided clocks within a constant period of time. The target value of the toggle number denotes a value indicating a click number of times targeted as a proper frequency-divided clock within a constant period of time. The comparison part 32 compares with each other the toggle number of the frequency-divided signal DIV supplied from the frequency-division part 24 and the target value, and generates a difference factor representing the difference between the toggle number and the target value, as a comparison result CR. The calibration-value-calculating part 33 calculates a calibration value based on the comparison result CR. The calibration operation block 14 executes the calibration operation based on the toggle number of the frequency-divided signal DIV supplied from the frequency-division part 24 (namely, actually measured values) for the 1st band, the 2nd band and the 3rd band divided from or constituting the entire transmission frequency range, for example, from 2.402 GHz to 2.48 GHz. The calibration operation block 14 generates actually measured calibration values ACV, namely the 1st calibration values, for the central frequencies of the 1st to 3rd bands respectively.

The interpolation calculation block 15 preforms an interpolation-calculation based on the actually measured calibration values ACV for the 1st to the 3rd band supplied from the calibration operation block 14, and calculates calibration values for the central frequencies of the 1st to the 3rd bands' intermediate frequencies, and calculates calibration values at frequencies at both ends of the entire transmission frequency range respectively. The interpolation calculation block 15 supplies the calculated calibration values, as interpolated calibration values ICV namely the secondary calibration values, to the calibration value holding block 16.

The calibration value holding block 16 holds both the actually measured calibration values ACV supplied from the calibration operation block 14 and the interpolated calibration values ICV supplied from the interpolation calculation block 15. The calibration value holding block 16 operates as a calibration value supply part for selecting one calibration value corresponding to the channel selection signal CS (i.e., the transmission frequency signal TS) from among the actually measured calibration values ACV or the interpolated calibration values ICV and supplying the selected calibration value as a calibration value CV to the PLL block 13.

The output part 17 generates the output signal OPS as a transmission signal.

Figure 3:
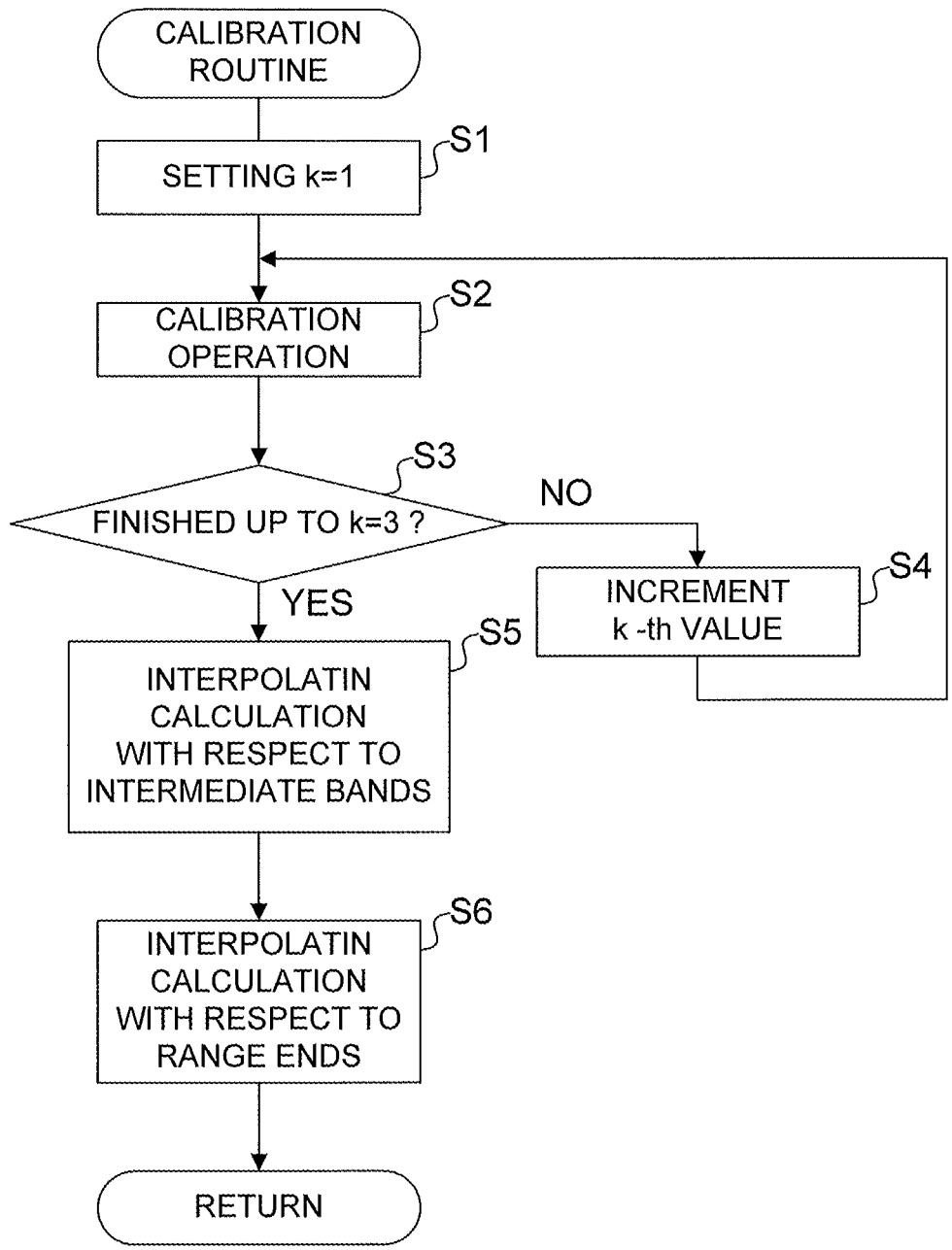
FIG. 3 is a flow chart showing a routine of performing a calibration of modulation index.

The operations of the frequency modulation circuit 10 performing the calibration according to the present invention will be described in detail with reference to FIGS. 3 and 4.

The calibration operation block 14 sets a target band (e.g. k-th band) of the calibration operation based on the actually measured values to the 1st band (namely, k=1) (Step S1).

The calibration operation block 14 reads out a target value for the central frequency of the k-th band from the register 31. The comparison part 32 compares with each other the read out target value with the toggle number (namely, the actually measured values) of the frequency-divided signal DIV supplied from the frequency-division part 24, and calculates a difference between the read out target value and the toggle number as a comparison result CR. The calibration-value-calculating part 33 executes the calibration operation based on the comparison result CR, resulting in obtaining it as an actually measured calibration value ACV of the k-th band (Step S2).

The calibration operation block 14 determines whether or not the calibration operations based on the actually measured values are finished with respect to the 1st to 3rd bands respectively (Step S3). If the calibration operations based on the actually measured values are not finished with respect to the 1st to 3rd bands, then the k-th value is incremented by one (Step S4), and the operation goes back to Step S2.

Figure 4A:
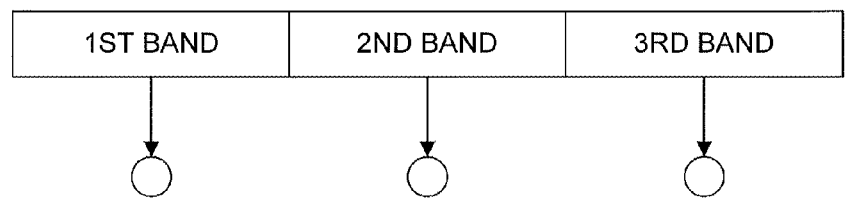
FIGS. 4A, 4B, 4C and 4D are schematic diagrams each showing a method for performing the calibration of modulation index according to the present invention.

When the calibration operation block 14 performs the calibration operation based on the actually measured values up to the 3rd band (namely, k=3), as shown in FIG. 4A, the actually measured calibration values ACV are obtained with respect to the 1st band, the 2nd band and the 3rd band. The calibration operation block 14 supplies the actually measured calibration values ACV to the interpolation calculation block 15.

Figure 4B:
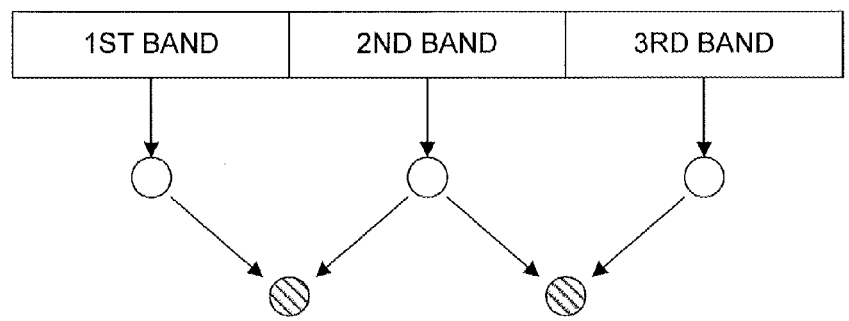

When the calibration operation based on the actually measured values are finished with respect to the 1st to 3rd bands, the interpolation calculation block 15 preforms interpolation-calculations with respect to the intermediate bands based on the actually measured calibration values ACV of the 1st to 3rd bands, and then generates the interpolated calibration values ICV (Step S5). Specifically, as shown in FIG. 4B, the interpolation calculation block 15 calculates averages of the actually measured calibration values ACV with respect to the neighboring 1st band and the 2nd band respectively, and then obtains the interpolated calibration values ICV of intermediate values of the central frequencies (namely, the intermediate bands) of the 1st band and the 2nd band. Similarly, the interpolation calculation block 15 calculates averages of the actually measured calibration values ACV with respect to the neighboring 2nd band and the 3rd band respectively, and then obtains the interpolated calibration values ICV of intermediate values of the central frequencies (namely, the intermediate bands) of the 2nd band and the 3rd band.

Figure 4C:
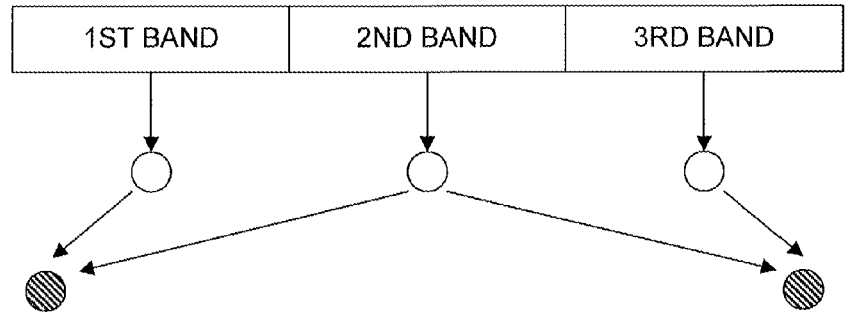

As shown in FIG. 4C, the interpolation calculation block 15 calculates calibration values with respect to both ends of the entire transmission frequency range by a linear interpolation, and obtains the interpolated calibration values ICV (Step S6).

Figure 4D:
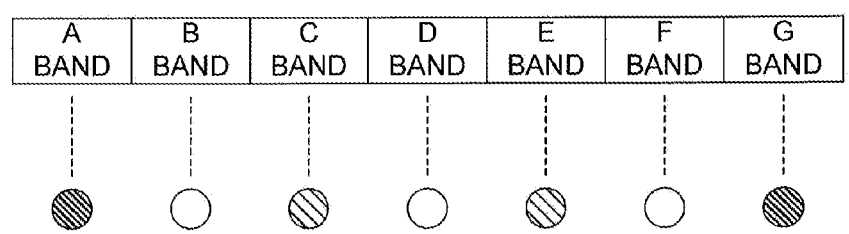

Through the above steps, as shown in FIG. 4D, the calibration values are obtained with respect to 7 pieces of the A to G bands.

Figure 5:
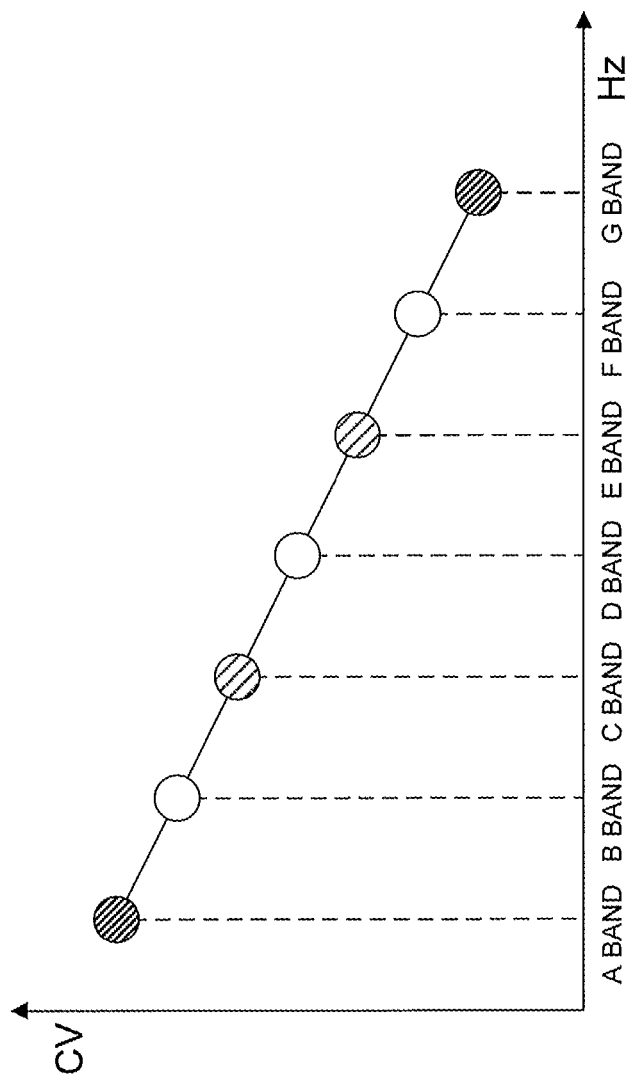
FIG. 5 is a graph showing a relationship between the calibration value and the frequency in the calibration of modulation index in Example 1.

FIG. 5 is a graph showing a relationship between the transmission frequency and the calibration value. The calibration values of the bands B, D and F corresponds to the actually measured calibration values ACV of the 1st to the 3rd bands calculated by the calibration operation block 14 respectively. The calibration value of the band C corresponds to the interpolated calibration value ICV of an average of the actually measured calibration values ACV of the 1st band and the 2nd band calculated by the interpolation calculation block 15. The calibration value of the band D corresponds to the interpolated calibration value ICV of an average of the actually measured calibration values ACV of the 2nd band and the 3rd band calculated by the interpolation calculation block 15. The calibration values CV of the bands A and G correspond to the interpolated calibration values ICV calculated with a linear interpolation based on the calibration value CV of the bands B to F by the interpolation calculation block 15.

As seen from the above mentioned description, this Example of the frequency modulation circuit 10 executes the calibration operation with respect to 3 pieces of bands (the bands B, D and F) based on the actually measured values and, after obtaining the calibration value, calculates the calibration values with respect to the other 4 pieces of bands (the bands A, C, E and G) by the calculation of averages and a linear interpolation.

Therefore, it is realized to perform the calibration within a short time period, because, while the calibration with a higher accuracy can be performed by obtaining calibration values based on the actually measured values, the PLL block 13 and its peripheral circuits (the calibration operation block 14, the interpolation calculation block 15 or the like) have only to be driven just during a period of time for obtaining the calibration values of only 3 pieces of bands.

EXAMPLE 2

The frequency modulation circuit 10 in the configuration of Example 2 is common with that of Example 1, but the interpolation calculation performed by the interpolation calculation block 15 in the operation of Example 2 is different from that of Example 1. Namely, operations up to Step S4 in the flow chart of FIG. 3 of Example 2 are the same as those of Example 1, but operations of Step S5 and Step S6 are different from those of Example 1.

The interpolation calculation block 15 preforms an interpolation-calculation by using a non-linear function on the basis of the actually measured calibration values ACV with respect to the 1st to the 3rd bands supplied from the calibration operation block 14 and generates the interpolated calibration values ICV.

The interpolation calculation block 15 calculates the calibration values of the intermediate bands with respect to the 1st band and the 2nd band by using a non-linear function, and obtains the interpolated calibration values ICV. Also the interpolation calculation block 15 calculates the calibration values of the intermediate bands with respect to the 2nd band and the 3rd band by using a non-linear function, and obtains the interpolated calibration values ICV (Step S5).

The interpolation calculation block 15 calculates the calibration values at both ends of the entire transmission frequency range by using a non-linear function, and obtains the interpolated calibration values ICV (Step S6).

As seen from the above mentioned description, the Examples of the frequency modulation circuit 10 execute the calibration operation with respect to 3 pieces of bands (the bands B, D and F) based on the actually measured values and, after obtaining the calibration value CV, calculates the calibration values with respect to the other 4 pieces of bands (the bands A, C, E and G) by the interpolation calculation using a non-linear function.

Figure 6:
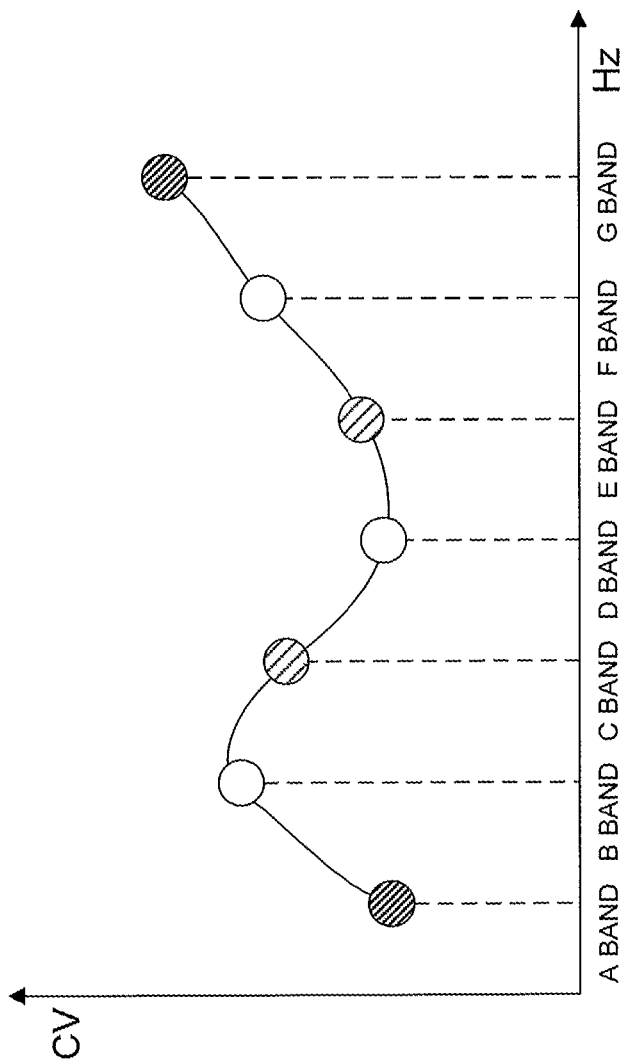
FIG. 6 is a graph showing a relationship between the calibration value and the frequency in the calibration of modulation index in Example 2.

Even if, as shown in FIG. 6, the calibration value of the modulation index in the PLL block 13 has a non-linear characteristics with respect to frequency, the calibration value can be obtained by the interpolation calculation.

In a similar fashion to Example 1, the frequency modulation circuit 10 according to the present invention executes the calibration operation with respect to 3 pieces of bands (the bands B, D and F) based on the actually measured values and, after obtaining the calibration value, calculates the calibration values with respect to the other 4 pieces of bands (the bands A, C, E and G) by the interpolation calculation. Since it is possible to perform the calibration operation with a higher accuracy by calculating the calibration value based on the actually measured values, while the PLL block 13 and its peripheral circuits (the calibration operation block 14, the interpolation calculation block 15 or the like) have only to be driven just during a period of time for obtaining the calibration values of only 3 pieces of bands. Therefore, it is possible to perform the calibration within a short time period.

Embodiments of the present invention are not limited by the foregoing Examples. For example, in addition to the foregoing Example adapted to the PLL having a direct modulation type VCO, the present invention is adaptable to a non-direct modulation type VCO.

In the foregoing Example, after the actually measured calibration values ACV are calculated with respect to the 1st to the 3rd of 3 pieces of bands, the interpolated calibration values ICV are calculated with respect to 2 pieces of the intermediate bands and the both end bands (4 pieces of the intermediate bands in total) by the interpolation calculation. However, the numbers of bands are not limited by these vales. For example, the following is possible. After the actually measured calibration values ACV are calculated with respect to 5 pieces of bands, the interpolated calibration values ICV are calculated with respect to 4 pieces of the intermediate bands and the both end bands (6 pieces of the intermediate bands in total) by the interpolation calculation. The present invention may include the following situation: after the actually measured calibration values ACV are calculated with respect to n (where the n denotes an integer of 2 or more) pieces of bands, the interpolated calibration values ICV are calculated with respect to (n−1) pieces of the intermediate bands and the both end bands (i.e., (n+1) pieces of bands in total) by the interpolation calculation.

In other words, frequency modulation circuit (10) comprising: a modulation part (13) for performing a frequency modulation with an input data signal while calibrating a modulation index based on a calibration value; a transmission frequency band setting part (11) for selecting and setting a transmission frequency band in accordance with a given channel selection signal within an entire transmission frequency range; a calibration-operating part (14) for calculating, on the basis of the input signal, primary calibration values of the modulation index at the central frequencies of respective ones of n (where the n denotes an integer of 2 or more) pieces of transmission frequency bands which constitute the entire transmission frequency range; an interpolation-calculation part (15) for performing an interpolation-calculation with respect to the n pieces of the primary calibration values and calculating calibration values at intermediate frequencies of the central frequencies of neighboring ones of the transmission frequency bands while calculating calibration values at frequencies at both ends of the entire transmission frequency range to obtain (n+1) pieces of interpolated calibration values as secondary calibration values; and a calibration value supply part (16) for selecting one calibration value corresponding to the transmission frequency bands set in the transmission frequency band setting part from among the n pieces of the primary calibration values or (n+1) pieces of the secondary calibration values, and supplying the selected calibration value to the modulation part.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims.

This application is based upon and claims the benefit of priority from the prior Japanese Patent Application No. 2014-261136 filed on Dec. 24, 2014, the entire contents of which are incorporated herein by reference.

What is claimed is:

1. A frequency modulation circuit comprising:
a modulation part for performing a frequency modulation with an input data signal while calibrating a modulation index based on a calibration value;
a transmission frequency band setting part for selecting and setting a transmission frequency band in accordance with a given channel selection signal within an entire transmission frequency range; and a calibration-operating part for calculating, on the basis of said input signal, primary calibration values of the modulation index at the central frequencies of respective ones of n (where the n denotes an integer of 2 or more) pieces of transmission frequency bands which constitute said entire transmission frequency range, further comprising;

an interpolation-calculation part for performing an interpolation-calculation with respect to said n pieces of said primary calibration values and calculating calibration values at intermediate frequencies of the central frequencies of neighboring ones of the transmission frequency bands while calculating calibration values at frequencies at both ends of said entire transmission frequency range to obtain (n+1) pieces of interpolated calibration values as secondary calibration values; and a calibration value supply part for selecting one calibration value corresponding to the transmission frequency bands set in said transmission frequency band setting part from among said n pieces of the primary calibration values or (n+1) pieces of the secondary calibration values, and supplying the selected calibration value to said modulation part.

2. The frequency modulation circuit according to claim 1, wherein said interpolation-calculation part calculates the calibration values in the intermediate frequencies by calculating an average of calibration values of the central frequencies of said neighboring ones of the transmission frequency bands,
wherein said interpolation-calculation part calculates the calibration values in frequencies at both ends of said entire transmission frequency band by preforming linear interpolation.

3. The frequency modulation circuit according to claim 1, wherein said interpolation-calculation part calculates the calibration values in the intermediate frequencies on the basis of a non-linear function,
wherein said interpolation-calculation part calculates the calibration values in frequencies at both ends of said entire transmission frequency band by preforming non-linear interpolation.

4. The frequency modulation circuit according to claim 1, wherein said modulation part comprising:
a voltage control oscillation circuit;
a frequency-division part generating the frequency-divided signals by performing frequency division of the oscillation signal of said voltage control oscillation circuit; and
a phase comparison part comparing said frequency-divided signals with a predetermined source oscillation signal in phase to generate a phase difference signal representing the phase difference between the frequency-divided signal and the predetermined source oscillation signal and to supply the phase difference signal to said voltage control oscillation circuit,
wherein said voltage control oscillation circuit adjusts said oscillation signal on the basis of said phase difference signal and a multiplication result of said input data signal and said calibration values.

5. The frequency modulation circuit according to claim 4, wherein said calibration-operating part comprising: a register storing of a target value for a number of toggle of the frequency-divided signals,
wherein said calibration-operating part compares the number of toggle of the frequency-divided signals supplied from said frequency-division part with said target value to obtain said n pieces of the primary calibration values.

6. A semiconductor device comprising a frequency modulation circuit for performing a frequency modulation with an input data to output an output signal,
said frequency modulation circuit comprising:
a modulation part for performing a frequency modulation with an input data signal while calibrating a modulation index based on a calibration value;
a transmission frequency band setting part for selecting and setting a transmission frequency band in accordance with a given channel selection signal within an entire transmission frequency range; and
a calibration-operating part for calculating, on the basis of said input signal, primary calibration values of the modulation index at the central frequencies of respective ones of n (where the n denotes an integer of 2 or more) pieces of transmission frequency bands which constitute said entire transmission frequency range,
said frequency modulation circuit further comprising;
an interpolation-calculation part for performing an interpolation-calculation with respect to said n pieces of said primary calibration values and calculating calibration values at intermediate frequencies of the central frequencies of neighboring ones of the transmission frequency bands while calculating calibration values at frequencies at both ends of said entire transmission frequency range to obtain (n+1) pieces of interpolated calibration values as secondary calibration values; and
a calibration value supply part for selecting one calibration value corresponding to the transmission frequency bands set in said transmission frequency band setting part from among said n pieces of the primary calibration values or (n+1) pieces of the secondary calibration values, and supplying the selected calibration value to said modulation part.

7. The semiconductor device according to claim 6, wherein said interpolation-calculation part calculates the calibration values in the intermediate frequencies by calculating an average of calibration values of the central frequencies of said neighboring ones of the transmission frequency bands,
wherein said interpolation-calculation part calculates the calibration values in frequencies at both ends of said entire transmission frequency band by preforming linear interpolation.

8. The semiconductor device according to claim 6, wherein said interpolation-calculation part calculates the calibration values in the intermediate frequencies on the basis of a non-linear function,
wherein said interpolation-calculation part calculates the calibration values in frequencies at both ends of said entire transmission frequency band by preforming a non-linear interpolation.

9. The semiconductor device according to claim 6, wherein said modulation part comprising:
a voltage control oscillation circuit;
a frequency-division part generating the frequency-divided signals by performing frequency division of the oscillation signal of said voltage control oscillation circuit; and
a phase comparison part comparing said frequency-divided signals with a predetermined source oscillation signal in phase to generate a phase difference signal representing the phase difference between the frequency-divided signal and the predetermined source oscillation signal and to supply the phase difference signal to said voltage control oscillation circuit, wherein said voltage control oscillation circuit adjusts said oscillation signal on the basis of said phase difference signal and a multiplication result of said input data signal and said calibration values.

10. The semiconductor device according to claim 9, wherein said calibration-operating part comprising: a register storing of a target value for a number of toggle of the frequency-divided signals, wherein said calibration-operating part compares the number of toggle of the frequency-divided signals supplied from said frequency-division part with said target value to obtain said n pieces of the primary calibration values.

* * * * *